(12) United States Patent
Ngo et al.

(10) Patent No.: US 6,707,749 B2
(45) Date of Patent: Mar. 16, 2004

(54) ENABLING AN INTERIM DENSITY FOR TOP BOOT FLASH MEMORIES

(75) Inventors: Quan H. Ngo, Sacramento, CA (US); Saad Monasa, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/218,955

(22) Filed: Aug. 14, 2002

(65) Prior Publication Data

US 2004/0032789 A1 Feb. 19, 2004

(51) Int. Cl.$^7$ .................................................. G11C 8/00
(52) U.S. Cl. .............................. 365/230.03; 365/185.11
(58) Field of Search ..................... 365/230.03, 185.11

(56) References Cited

U.S. PATENT DOCUMENTS 5,880,996 A  * 3/1999 Roohparvar ........... 365/185.33
5,982,661 A  * 11/1999 Kawamata ............. 365/185.01
6,567,306 B2 * 5/2003 Lee ...................... 365/185.11

* cited by examiner

*Primary Examiner*—Michael S. Lebentritt
*Assistant Examiner*—Tran T. Nguyen
(74) *Attorney, Agent, or Firm*—Trop, Pruner & Hu, P.C.

(57) ABSTRACT

An interim density top boot flash memory architecture may be implemented by locking a portion or block of memory to prevent memory read and write accesses, thereby reducing the overall capacity of the memory. At the same time, this may be done without interfering with the access to parameters needed for implementing booting. In some embodiments, the locked memory may be placed at a block above the lowest addressable block that is accessed by an internal address.

20 Claims, 2 Drawing Sheets

ENABLING AN INTERIM DENSITY FOR TOP BOOT FLASH MEMORIES

BACKGROUND

This invention relates generally to semiconductor memories and, particularly, to flash memories.

Flash memories typically use a one transistor memory cell that allows for high memory densities, high reliability, and low power consumption. Commonly flash memory is provided in densities that come in standard multiples of a given density. For example, flash memory may be provided in multiples of 32 megabits. Some users may prefer to have an interim density or a density between two successive multiples, such as 48 megabits.

Flash memories generally come in either top boot or bottom boot configurations. The parameters utilized for the booting process in a bottom boot configuration are allocated to the lowest addressable addresses of the flash array. In the top boot configuration, those parameters are allocated to the highest addressable addresses.

To enable an interim density, normally bottom boot flash is utilized. In such case, the interim density may be easily implemented by disabling or locking a memory block (or blocks) associated with the highest (or higher) addressable addresses. In this way, the locked block(s) do not in any way interfere with access to the booting parameters that are stored in the lowest addressable addresses.

A problem arises in providing interim densities with top boot flash memories since the boot parameters are located in precisely the same blocks that would be disabled, normally, to produce the interim density.

Thus, there is a need for a way to enable interim densities in top boot flash memories.

DETAILED DESCRIPTION

Figure 1:
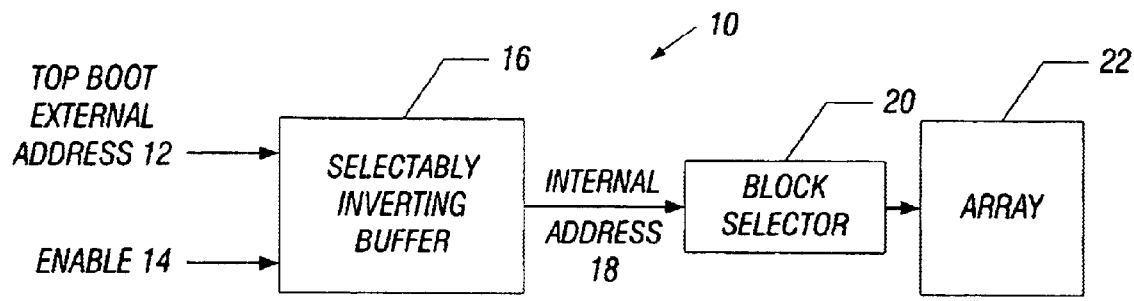
FIG. 1 is a block depiction of one embodiment of the present invention.

Referring to FIG. 1, a flash memory 10 may receive an external address 12 and an enable 14 that may be a chip enable or chip enable bar signal. Those signals are provided to a selectably inverting buffer 16. The buffer 16 may selectably invert one or more signals to generate an internal address 18 from the external address 12.

Generally, the flash memory 10 may be designed to a default configuration of either a top or bottom boot configuration. Then, as desired by the end user, the buffer 16 may be programmed to convert external addresses to internal addresses to generate either a top boot or a bottom boot architecture as desired. For example, the buffer 16 may include selectively openable fuses that either insert or remove an inverter gate in one embodiment. In one embodiment, if the default configuration is a top boot architecture, and if a bottom boot architecture is desired, the external address may be inverted. If a top boot architecture is the default configuration and a top boot architecture is the desired configuration, no inversion may occur.

The inversion of the external address to form the internal address changes the order of decoding the block addresses to implement the desired architecture. In other words, in one architecture, the boot parameters may be located at the highest addressable addresses and, in another architecture, they may be located in the lowest addressable addresses. The same external address signals may be utilized, but through the operation of the buffer 16, those external signals may be translated for the desired configuration.

The internal address 18 is then provided to a block selector 20. The block selector may use the most significant bit (MSB) of the internal address to access the appropriate blocks within a memory array 22 in one embodiment. Generally, a block may be one of a series of equally sized portions or sectors of flash memory array 22.

Figure 2:
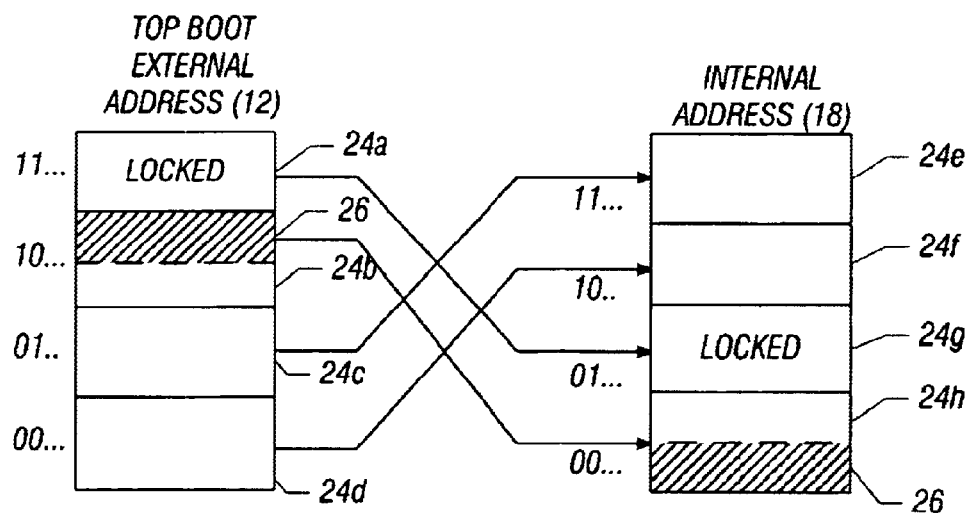
FIG. 2 illustrates the operation of the selectably inverting buffer shown in FIG. 1 in accordance with one embodiment of the present invention.

The operation of the buffer 16 is illustrated in FIG. 2. In the embodiment illustrated, the upper most block 24a, having the most significant bits [11], is locked. By locked, it is intended to refer to the situation where both writing to and reading from the block is prevented.

In such case, the boot parameters 26 (indicated as a shaded region within the block 24b having the most significant bits [10]) are located at the highest addressable address. This is consistent with the conventional top boot block architecture. However, those addresses may be converted to internal addresses consistent with a default bottom boot architecture.

In such case, an external address 12 directed to the locked block 24a is converted by buffer 16 to an internal address 18 having most significant bits [01], as indicated as block 24g. Similarly, the block 24b is converted to become the block 24h and the boot parameters 26 are provided in the internal address 18 as the lowest addressable addresses, as indicated at 26. Likewise, the block 24c addresses are converted by buffer 16 to address the block 24e, which has the highest addressable internal address and the block 24d becomes the block 24f, which has the second highest addressable addresses.

Thus, instead of the top block from the memory space being locked, buffer 16 may convert addresses and lock a different memory block. In addition, the address inversion is removed with respect to the second most significant bit (MSB-1) and replaced with a system in which the locked block is situated above the lowest addressable block and the parameters are provided in the next lowest internal addressable block. For example, as shown in FIG. 2, the most significant external address bit (e.g., one for blocks 24a and 24b and zero for blocks 24c and 24d) is inverted but the second most significant bit (one for blocks 24a and 24c and zero for blocks 24b and 24d) is not inverted.

Thus, an interim density may be achieved in a top boot flash memory without jeopardizing any performance aspects or introducing greater complexity into the design process, in some embodiments. Particularly, without inserting extra circuitry in the critical signal path, performance may be substantially unchanged or even improved in some cases. With a simple logic functionality, design changes may be reduced in terms of complexity, incremental die size and validation effort.

While the embodiment is illustrated in which the interim density is a quarter of the increment between successive densities, any lockable amount of density is possible in accordance with some embodiments of the present invention. Moreover, while an architecture is illustrated in which the default configuration is a bottom boot architecture, flash memories that have a default top boot architecture may be implemented in some embodiments of the present invention.

Figure 3:
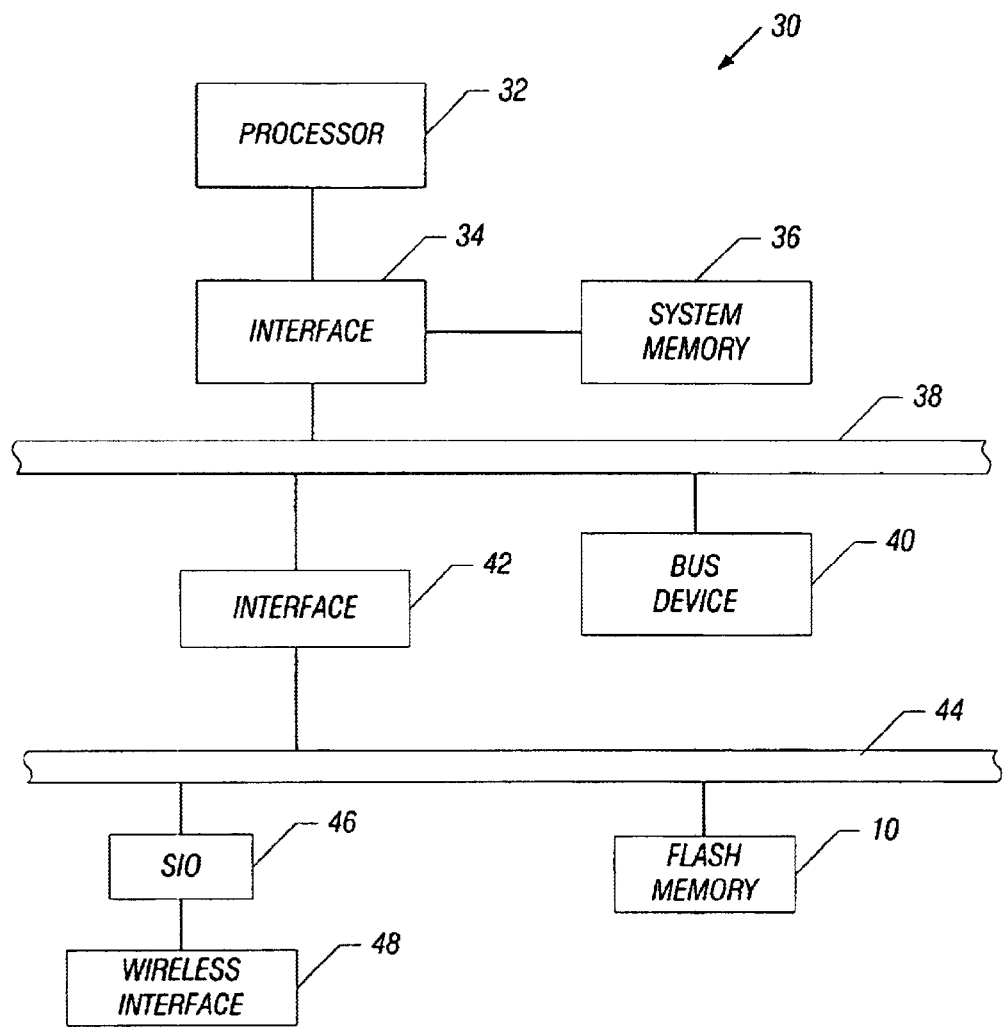
FIG. 3 is a block diagram of a system according to one embodiment of the present invention.

Referring to FIG. 3, a processor-based system 30, in one embodiment, may be a wireless processor-based system. In other words, the system 30 may communicate with other devices through a wireless interface 48 over an appropriate wireless protocol, such as a short range wireless protocol or a cellular telephone protocol, to mention two examples. The system 30 may include a processor 32 coupled by an interface 34 to a bus 38 and a system memory 36.

The bus 38, in turn, may be coupled to one or more bus devices 40 and another interface 42. In one embodiment, the interface 42 may be coupled to still another bus 44. The bus 44 may couple the flash memory 10, which in one embodiment may store the system boot parameters that are part of the basic input/output system (BIOS). The bus 44 may also couple to a serial input/output (SIO) interface 46 that, in turn, is connected to a wireless interface 48.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of generating an interim density top boot flash memory comprising:

locking a portion of the addressable memory space of a top boot flash memory to generate an interim density top boot flash memory.

2. The method of claim 1 further comprising changing the configuration of the flash memory from the top boot configuration to the bottom boot configuration by inverting the most significant bit of the address received by the flash memory.

3. The method of claim 1 further comprising:

inverting at least one bit of an address received by a flash memory having a top boot configuration to convert memory accessing to a bottom boot configuration.

4. The method of claim 3 wherein locking a portion of the addressable memory space includes defining a plurality of blocks in said addressable space.

5. The method of claim 4 including locking a block above the block including the lowest addressable addresses.

6. The method of claim 5 including locking the block immediately above the block including the lowest addressable addresses.

7. The method of claim 6 including providing the boot parameters in a block including the lowest addressable addresses.

8. The method of claim 3 including translating an external address to a locked block that is the highest addressable address to an internal address that is above the lowest addressable address block.

9. The method of claim 8 including converting an external address to boot parameters in the second highest addressable address to an internal address that includes boot parameters at the lowest addressable address.

10. The method of claim 9 including disabling address inversion including disabling the addressed inversion for the second most significant bit.

11. A flash memory comprising:

a memory array;

a device to enable a top boot flash memory configuration; and a circuit to enable the locking of a portion of the memory array to generate an interim density top boot flash device.

12. The memory of claim 11 wherein said array includes blocks and one of said blocks is locked.

13. The memory of claim 12 including a selectably inverting buffer and a block selector, said selectably inverting buffer receiving an external address and outputting an internal address to said block selector.

14. The memory of claim 13 wherein a block above the lowest addressable addresses in the array is locked.

15. The memory of claim 12 including boot parameters stored in a block including the lowest addressable addresses.

16. The memory of claim 13 wherein said buffer translates an external address to a locked block that is the highest addressable address to an internal address that is above the lowest addressable address.

17. A processor-based system comprising:

a processor;

a Static Random Access Memory (SRAM) coupled to the processor; and a non-volatile memory coupled to the processor to receive an address, said non-volatile memory being a top boot flash memory, a portion of the addressable memory space of said memory is lockable to generate an interim density top boot flash device.

18. The system of claim 17 wherein said flash memory acts as part of the basic input/output system for said system.

19. The system of claim 17 wherein said processor is coupled to at least one bus coupled to said flash memory.

20. The system of claim 17 including a wireless interface coupled to said processor, said system including a bus and a serial input/output device coupled to said bus, said wireless interface coupled to said serial input/output device.

* * * * *